US012571853B2

(12) United States Patent (10) Patent No.: US 12,571,853 B2
Gering et al. (45) Date of Patent: Mar. 10, 2026

(54) PREDICTING AGING OF BATTERIES

(71) Applicant: Battelle Energy Alliance, LLC, Idaho Falls, ID (US)

(72) Inventors: Kevin L. Gering, Idaho Falls, ID (US); Zonggen Yi, Idaho Falls, ID (US); Sangwook Kim, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 463 days.

(21) Appl. No.: 18/170,471

(22) Filed: Feb. 16, 2023

(65) Prior Publication Data

US 2023/0258733 A1      Aug. 17, 2023

Related U.S. Application Data

(60) Provisional application No. 63/268,169, filed on Feb. 17, 2022.

(51) Int. Cl.
| | |
|---|---|
| *G01R 31/392* | (2019.01) |
| *G01R 31/367* | (2019.01) |
| *G01R 31/389* | (2019.01) |
| *G06N 20/00* | (2019.01) |

(52) U.S. Cl.
CPC ......... *G01R 31/392* (2019.01); *G01R 31/367* (2019.01); *G01R 31/389* (2019.01); *G06N 20/00* (2019.01)

(58) Field of Classification Search
CPC .. H01M 10/48; H01M 10/052; H01M 10/425; H01M 10/42; H01M 10/4285; H01M 10/486; H01M 2010/4271; H01M 10/4257; H01M 10/44; H01M 10/448; H01M 10/488; H01M 2010/4278; H01M 2010/4292; G01R 31/392; G01R 31/367; G01R 31/389; G01R 31/387; G06N 20/00; G06N 3/09; G06N 3/0464
See application file for complete search history.

(56) References Cited

U.S. PATENT DOCUMENTS

| | | | | |
|---|---|---|---|---|
| 5,825,156 A | * | 10/1998 | Patillon | ................ G01R 31/367 |
| | | | | 713/340 |
| 6,064,180 A | * | 5/2000 | Sullivan | .................. B60L 58/10 |
| | | | | 320/132 |
| 9,625,532 B2 | * | 4/2017 | Gering | ................. G01R 31/392 |

(Continued)

*Primary Examiner* — Mohammad K Islam
(74) *Attorney, Agent, or Firm* — TraskBritt

(57) ABSTRACT

Embodiments disclosed herein include methods, systems and/or devices configured to generate historical parameters of a sigmoidal rate expression based on the sigmoidal rate expression and measured data of a battery. The embodiments may further be configured to predict future parameters of the sigmoidal rate expression based on the sigmoidal rate expression and the historical parameters. The embodiments may further be configured to predict an aging state of the battery based on the sigmoidal rate expression and the future parameters. Additional embodiments are directed to methods, systems, and/or devices configured to synthesize training data based on measured battery data, a sigmoidal rate expression, and ranges for parameters of the sigmoidal rate expression. The additional embodiments may further be configured to train a machine-learning model using the synthesized training data.

34 Claims, 12 Drawing Sheets

(56)                    References Cited

U.S. PATENT DOCUMENTS

| | | | |
|---|---|---|---|
| 2008/0234956 A1* | 9/2008 | Mizuno | G01R 31/367 |
| | | | 702/63 |
| 2014/0321733 A1* | 10/2014 | Glazoff | G06T 7/00 |
| | | | 382/206 |
| 2015/0369875 A1* | 12/2015 | Ishii | H01M 10/48 |
| | | | 702/63 |
| 2018/0095140 A1* | 4/2018 | Park | G01R 31/378 |
| 2020/0081070 A1* | 3/2020 | Chemali | H01M 10/425 |
| 2023/0333165 A1* | 10/2023 | Takegami | G01R 31/392 |

* cited by examiner

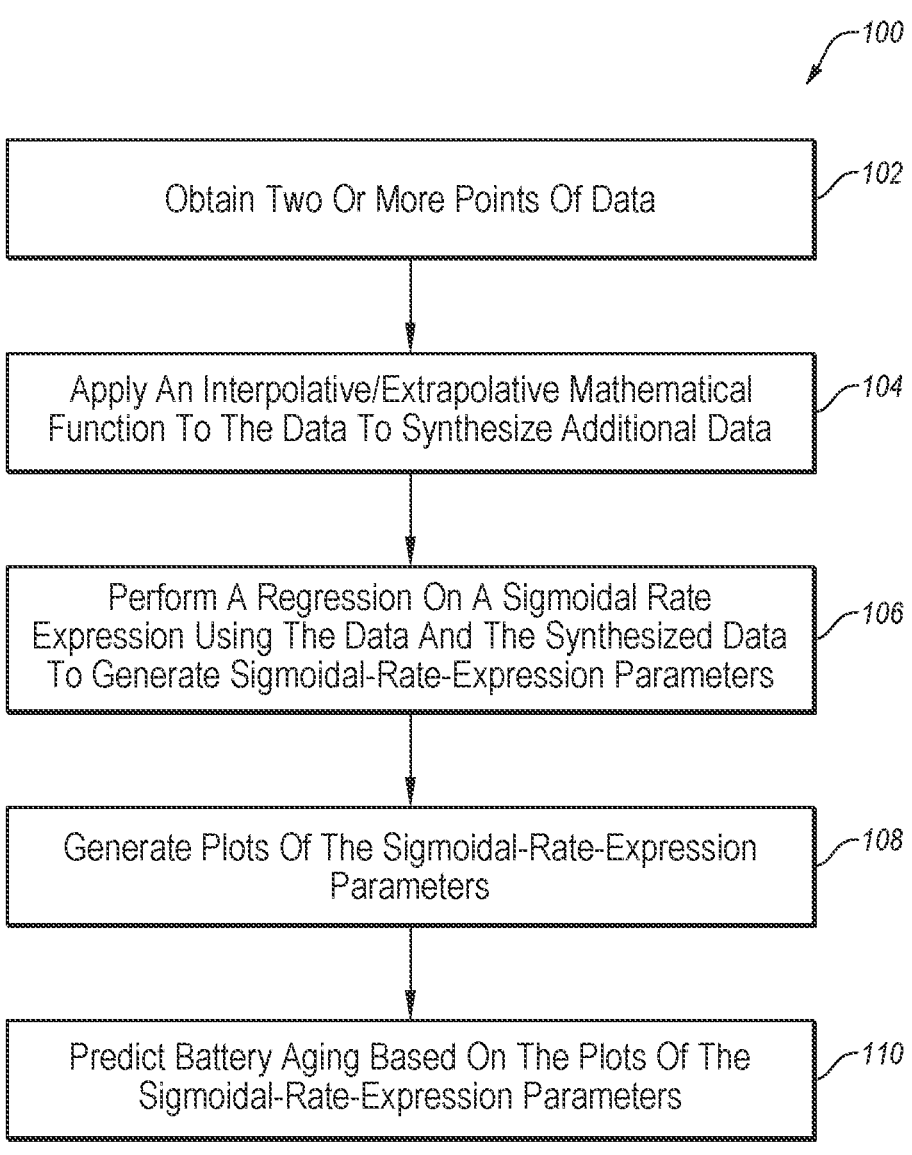

*100*

Obtain Two Or More Points Of Data   *102*

Apply An Interpolative/Extrapolative Mathematical Function To The Data To Synthesize Additional Data   *104*

Perform A Regression On A Sigmoidal Rate Expression Using The Data And The Synthesized Data To Generate Sigmoidal-Rate-Expression Parameters   *106*

Generate Plots Of The Sigmoidal-Rate-Expression Parameters   *108*

Predict Battery Aging Based On The Plots Of The Sigmoidal-Rate-Expression Parameters   *110*

*FIG. 1*

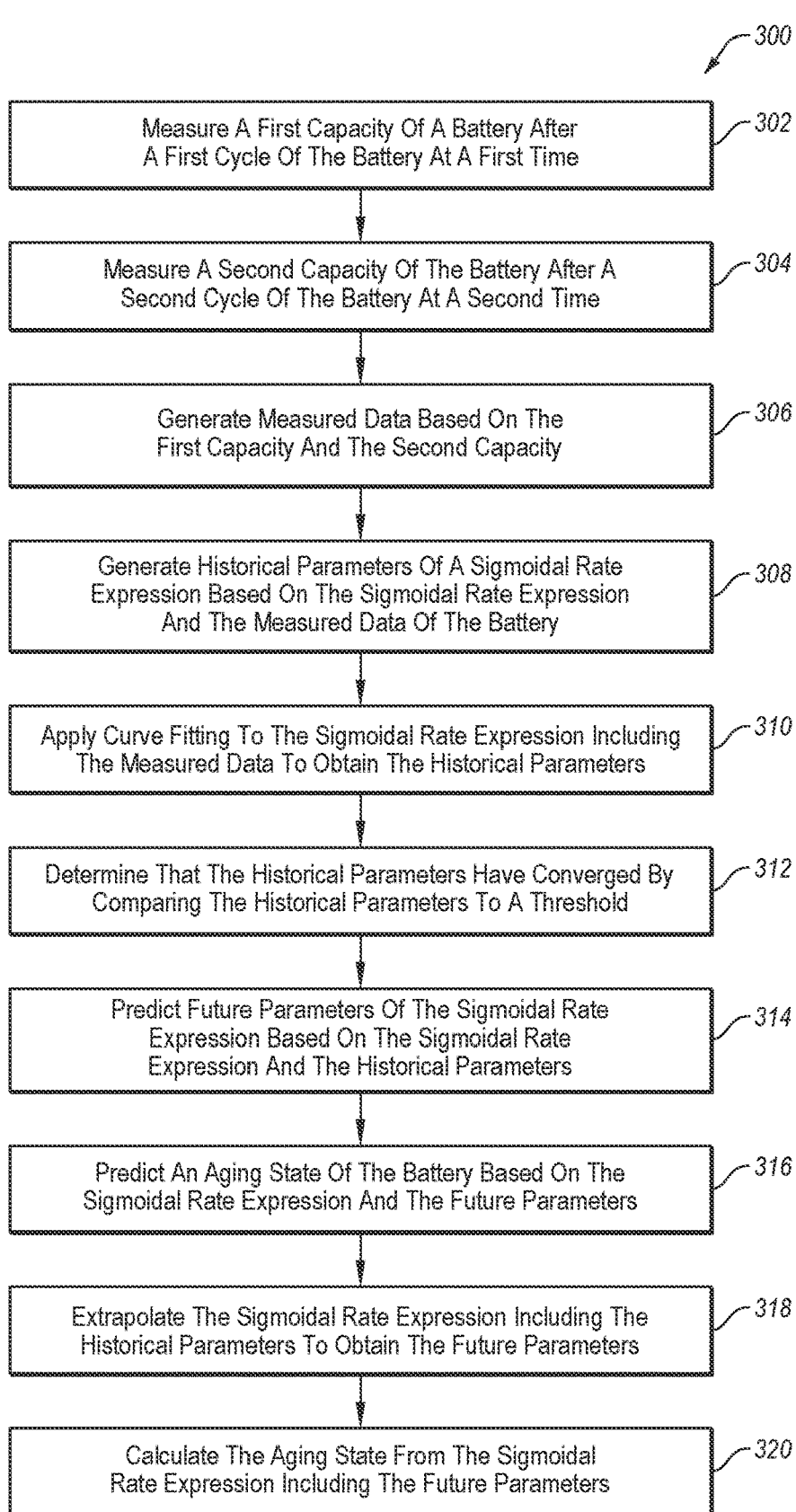

Measure A First Capacity Of A Battery After
A First Cycle Of The Battery At A First Time ⟋ 302

Measure A Second Capacity Of The Battery After A
Second Cycle Of The Battery At A Second Time ⟋ 304

Generate Measured Data Based On The
First Capacity And The Second Capacity ⟋ 306

Generate Historical Parameters Of A Sigmoidal Rate
Expression Based On The Sigmoidal Rate Expression
And The Measured Data Of The Battery ⟋ 308

Apply Curve Fitting To The Sigmoidal Rate Expression Including
The Measured Data To Obtain The Historical Parameters ⟋ 310

Determine That The Historical Parameters Have Converged By
Comparing The Historical Parameters To A Threshold ⟋ 312

Predict Future Parameters Of The Sigmoidal Rate
Expression Based On The Sigmoidal Rate
Expression And The Historical Parameters ⟋ 314

Predict An Aging State Of The Battery Based On The
Sigmoidal Rate Expression And The Future Parameters ⟋ 316

Extrapolate The Sigmoidal Rate Expression Including The
Historical Parameters To Obtain The Future Parameters ⟋ 318

Calculate The Aging State From The Sigmoidal
Rate Expression Including The Future Parameters ⟋ 320

FIG. 3

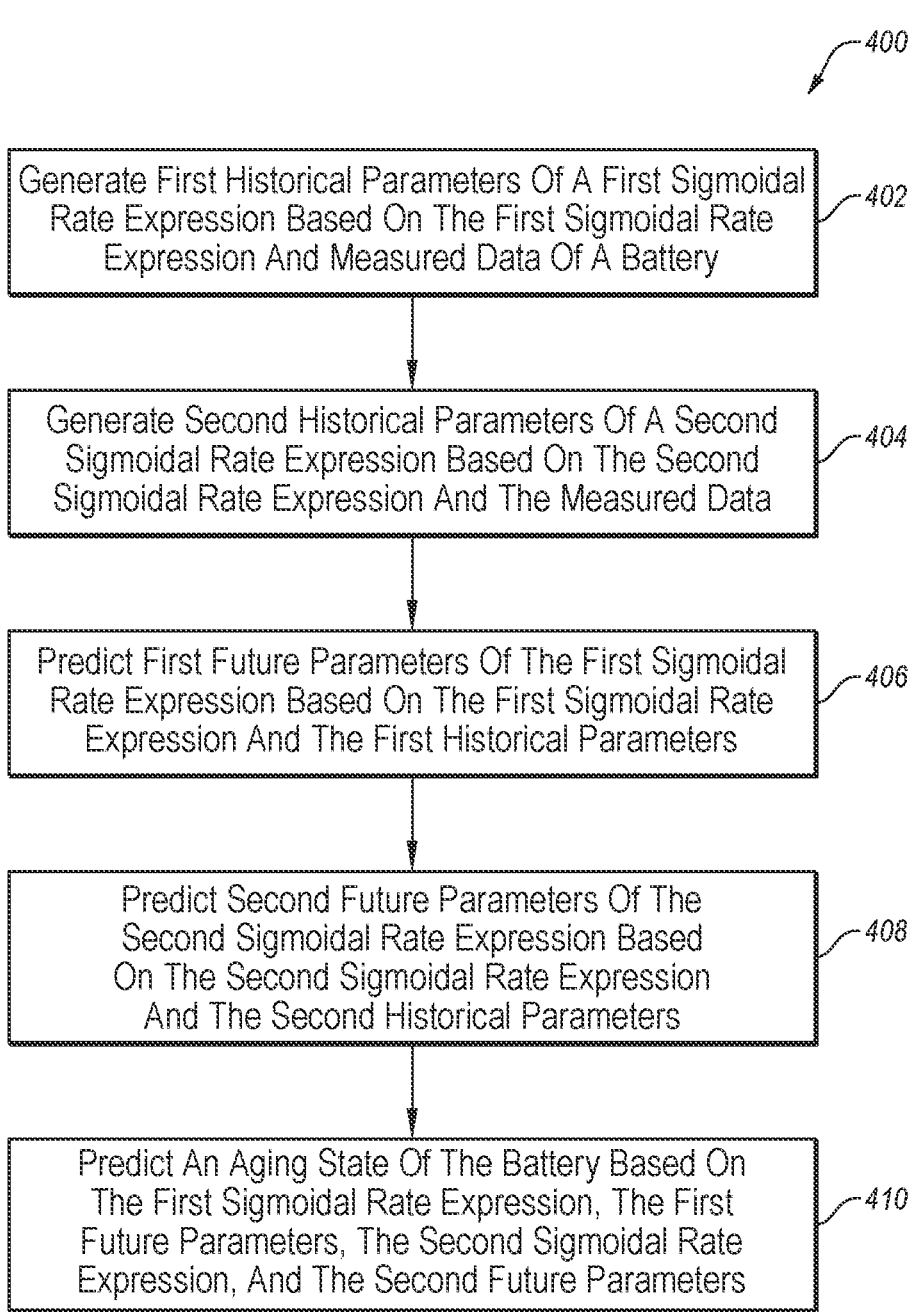

400

Generate First Historical Parameters Of A First Sigmoidal Rate Expression Based On The First Sigmoidal Rate Expression And Measured Data Of A Battery      402

Generate Second Historical Parameters Of A Second Sigmoidal Rate Expression Based On The Second Sigmoidal Rate Expression And The Measured Data      404

Predict First Future Parameters Of The First Sigmoidal Rate Expression Based On The First Sigmoidal Rate Expression And The First Historical Parameters      406

Predict Second Future Parameters Of The Second Sigmoidal Rate Expression Based On The Second Sigmoidal Rate Expression And The Second Historical Parameters      408

Predict An Aging State Of The Battery Based On The First Sigmoidal Rate Expression, The First Future Parameters, The Second Sigmoidal Rate Expression, And The Second Future Parameters      410

*FIG. 4*

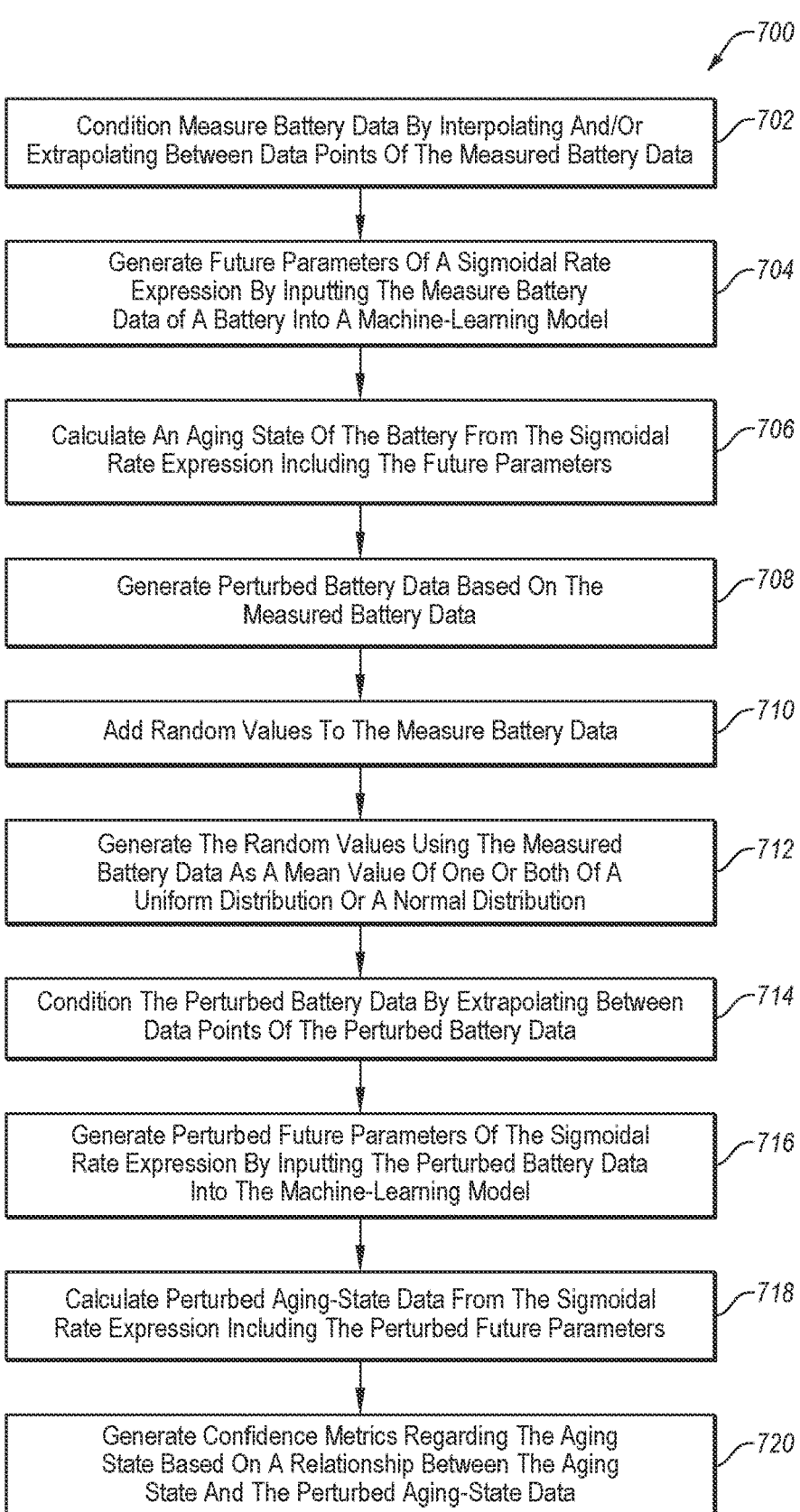

700

Condition Measure Battery Data By Interpolating And/Or Extrapolating Between Data Points Of The Measured Battery Data — 702

Generate Future Parameters Of A Sigmoidal Rate Expression By Inputting The Measure Battery Data of A Battery Into A Machine-Learning Model — 704

Calculate An Aging State Of The Battery From The Sigmoidal Rate Expression Including The Future Parameters — 706

Generate Perturbed Battery Data Based On The Measured Battery Data — 708

Add Random Values To The Measure Battery Data — 710

Generate The Random Values Using The Measured Battery Data As A Mean Value Of One Or Both Of A Uniform Distribution Or A Normal Distribution — 712

Condition The Perturbed Battery Data By Extrapolating Between Data Points Of The Perturbed Battery Data — 714

Generate Perturbed Future Parameters Of The Sigmoidal Rate Expression By Inputting The Perturbed Battery Data Into The Machine-Learning Model — 716

Calculate Perturbed Aging-State Data From The Sigmoidal Rate Expression Including The Perturbed Future Parameters — 718

Generate Confidence Metrics Regarding The Aging State Based On A Relationship Between The Aging State And The Perturbed Aging-State Data — 720

FIG. 7

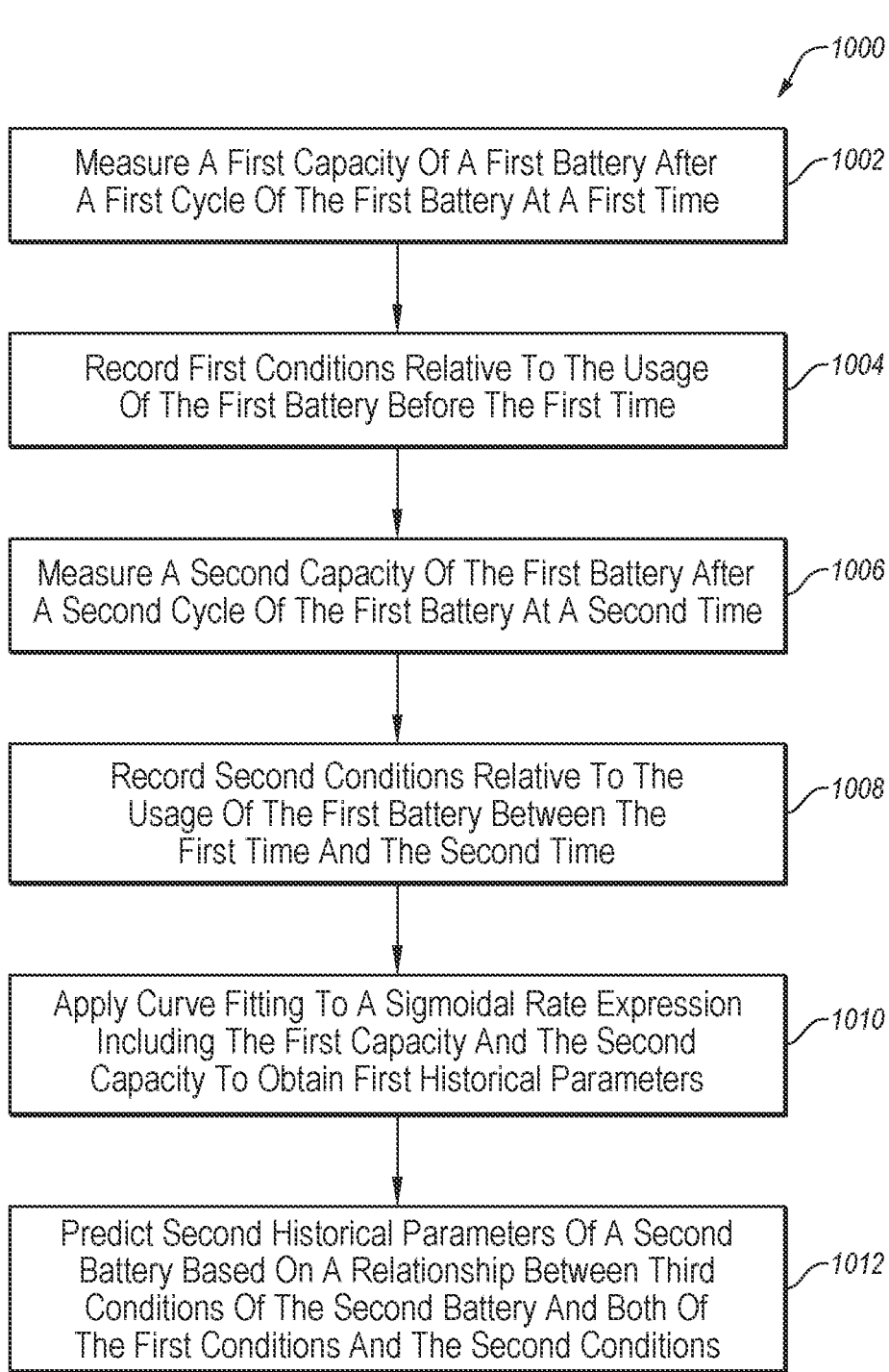

*1000*

Measure A First Capacity Of A First Battery After A First Cycle Of The First Battery At A First Time — *1002*

Record First Conditions Relative To The Usage Of The First Battery Before The First Time — *1004*

Measure A Second Capacity Of The First Battery After A Second Cycle Of The First Battery At A Second Time — *1006*

Record Second Conditions Relative To The Usage Of The First Battery Between The First Time And The Second Time — *1008*

Apply Curve Fitting To A Sigmoidal Rate Expression Including The First Capacity And The Second Capacity To Obtain First Historical Parameters — *1010*

Predict Second Historical Parameters Of A Second Battery Based On A Relationship Between Third Conditions Of The Second Battery And Both Of The First Conditions And The Second Conditions — *1012*

*FIG. 10*

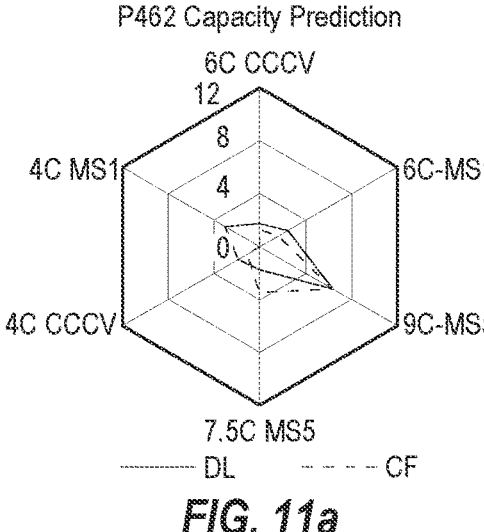
FIG. 11a
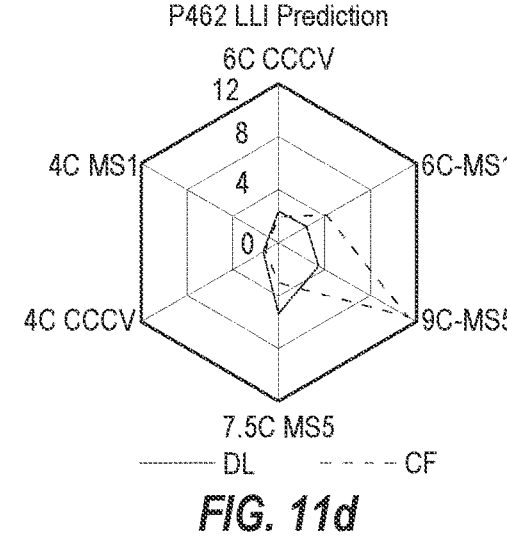
FIG. 11d
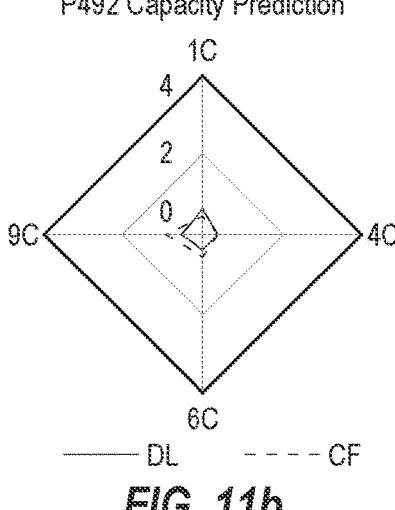
FIG. 11b
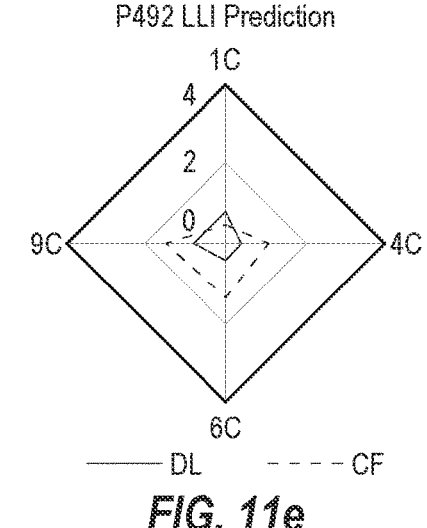
FIG. 11e
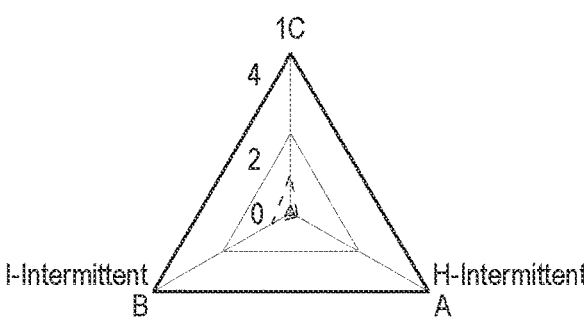
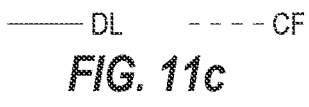
FIG. 11c
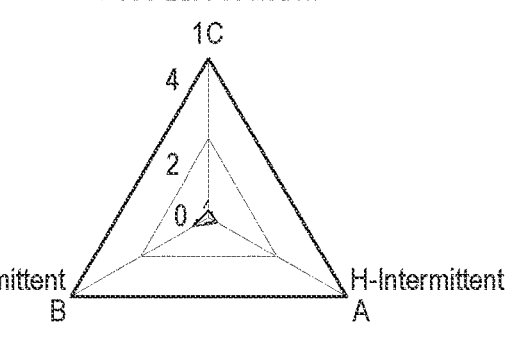
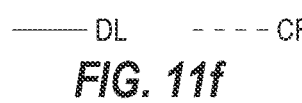
FIG. 11f

PREDICTING AGING OF BATTERIES

CROSS-REFERENCE TO RELATED APPLICATION

This application claims the benefit under 35 U.S.C. § 119 (e) of U.S. Provisional Patent Application Ser. No. 63/268, 169, filed Feb. 17, 2022, the disclosure of which is hereby incorporated herein in its entirety by this reference.

STATEMENT REGARDING FEDERALLY SPONSORED RESEARCH OR DEVELOPMENT

This invention was made with government support under Contract Number DE-AC07-05-ID14517 awarded by the United States Department of Energy. The government has certain rights in the invention.

TECHNICAL FIELD

Embodiments of the present disclosure relate to predicting aging of batteries.

BACKGROUND

A battery converts stored chemical energy to electrical energy, which may be conveyed as a voltage potential. Rechargeable batteries may be charged and discharged multiple times. As a rechargeable battery ages, the storage capacity and conductance of the rechargeable battery may decrease (i.e., fade) between a Beginning of Life (BOL) and an End of Life (EOL). Over the service life of the rechargeable battery, certain performance characteristics may experience losses, such as capacity fade (loss) and power loss, among others.

BRIEF SUMMARY

Embodiments disclosed herein include methods, systems and/or devices configured to generate historical parameters of a sigmoidal rate expression (SRE) based on the SRE and measured data of a battery. The embodiments may further be configured to predict future parameters of the sigmoidal rate expression based on the sigmoidal rate expression and the historical parameters. The embodiments may further be configured to predict an aging state of the battery based on the sigmoidal rate expression and the future parameters.

Additional embodiments are directed to methods, systems, and/or devices configured to synthesize training data based on measured battery data, a sigmoidal rate expression, and ranges for parameters of the sigmoidal rate expression. The additional embodiments may further be configured to train a machine-learning (ML) model using the synthesized training data.

Additional embodiments are directed to methods, systems, and/or devices configured to generate future parameters of a sigmoidal rate expression by inputting measured battery data of a battery into a machine-learning model. The additional embodiments may further be configured to calculate an aging state of the battery from the sigmoidal rate expression including the future parameters.

Additional embodiments are directed to methods, systems, and/or devices configured to measure a first capacity of a first battery after a first cycle of the first battery at a first time. The additional embodiments may further be configured to recording first conditions relative to the usage of the first battery before the first time. The additional embodiments may further be configured to measure a second capacity of the first battery after a second cycle of the first battery at a second time. The additional embodiments may further be configured to record second conditions relative to the usage of the first battery between the first time and the second time. The additional embodiments may further be configured to apply curve fitting to a sigmoidal rate expression including the first capacity and the second capacity to obtain first historical parameters. The additional embodiments may further be configured to predict second historical parameters of a second battery based on a relationship between third conditions of the second battery and both of the first conditions and the second conditions.

BRIEF DESCRIPTION OF THE DRAWINGS

FIG. 1 is a flowchart of an example method, in accordance with various embodiments of the disclosure.

FIG. 3 is a flowchart of an example method, in accordance with various embodiments of the disclosure.

FIG. 4 is a flowchart of an example method, in accordance with various embodiments of the disclosure.

FIG. 7 is a flowchart of an example method, in accordance with various embodiments of the disclosure.

FIG. 10 is a flowchart of an example method, in accordance with various embodiments of the disclosure.

FIGS. 11a-11f depicts various results associated with deep learning and curve fitting, according to various embodiments of the disclosure.

DETAILED DESCRIPTION

Figure 2:
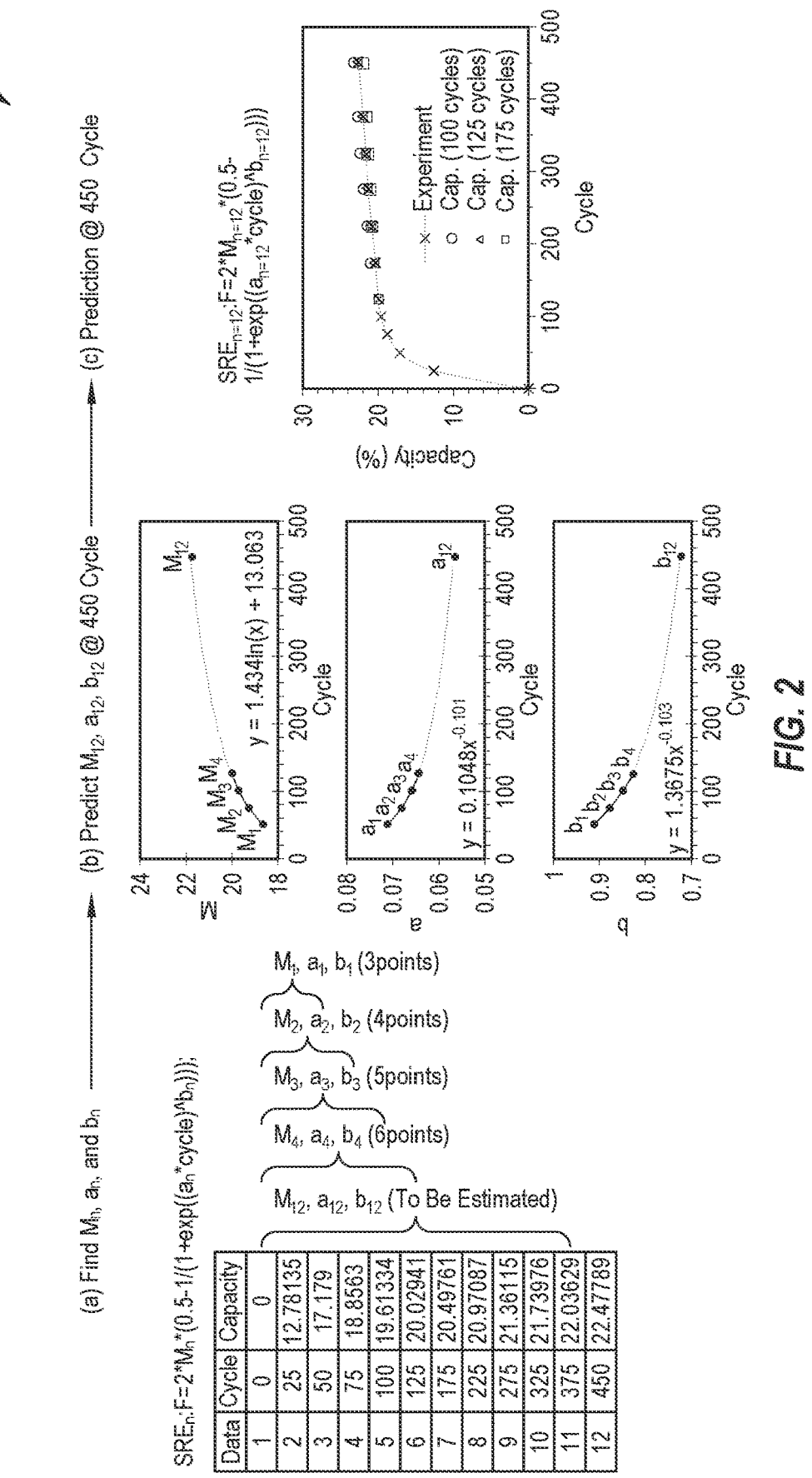
FIG. 2 illustrates a curve-fitting method, in accordance with various embodiments of the disclosure.

In the following detailed description, reference is made to the accompanying drawings, which form a part hereof, and in which are shown, by way of illustration, specific embodiments of the disclosure that may be practiced. These embodiments are described in sufficient detail to enable those of ordinary skill in the art to practice the invention, and it is to be understood that other embodiments may be utilized, and that structural, logical, and electrical changes may be made within the scope of the disclosure.

In this description, specific implementations are shown and described only as examples and should not be construed as the only way to implement the present disclosure unless specified otherwise herein. It will be readily apparent to one of ordinary skill in the art that the various embodiments of the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Referring in general to the following description and accompanying drawings, various embodiments of the present disclosure are illustrated to show their structure and method of operation. Common elements of the illustrated embodiments may be designated with similar reference numerals. It should be understood that the figures presented are not meant to be illustrative of actual views of any particular portion of the actual structure or method, but are merely idealized representations employed to more clearly and fully depict the present invention defined by the claims below.

It should be appreciated and understood that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the embodiments of the present disclosure may be implemented on any number of data signals including a single data signal.

It should be further appreciated and understood that the various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and acts are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the disclosure described herein.

The various illustrative logical blocks, modules, and circuits described in connection with the embodiments disclosed herein may be implemented or performed with a general-purpose processor, a special-purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the general-processor may be any conventional processor, controller, microcontroller, or state machine. A general-purpose processor may be considered a special-purpose processor while the general-purpose processor executes instructions (e.g., software code) stored on a computer-readable medium. A processor may also be implemented as a combination of computing devices, such as a combination of a DSP and a microprocessor, a plurality of microprocessors, one or more microprocessors in conjunction with a DSP core, or any other such configuration.

When executed as firmware or software, the instructions for performing the processes described herein may be stored on a computer-readable medium. A computer-readable medium includes, but is not limited to, non-transitory storage media, such as magnetic and optical storage devices such as disk drives, magnetic tape, CDs (compact disks), DVDs (digital versatile discs or digital video discs), and semiconductor devices such as RAM, DRAM, ROM, EPROM, and Flash memory.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Some embodiments of the present disclosure relate to diagnostic and predictive methods for determining battery health and lifetime projections that will maintain high accuracy over extended use conditions. The diagnostic and predictive methods may use few (e.g., three) data points. Further, the diagnostic and predictive methods may use data points from relatively early in the life cycle of a battery (e.g., data points taken during the first one hundred charging cycles). The accelerated diagnostic and predictive methods (ADPM) target battery health and lifetime, using a relationship to sigmoidal rate expressions (SRE). This allows embodiments to achieve accurate battery aging predictions based on a small subset of early test data, reducing the expense tied to prolonged battery testing and hence will support timely decisions and management actions to ensure battery safety and longer life.

Some embodiments of the present disclosure may use SRE diagnostic and predictive engines. SRE diagnostic and predictive engines may be suited for closed "batch reactor" systems like batteries. SRE parameters may provide a unique thumbprint of thermodynamic and kinetic aging information corresponding to the prevailing aging conditions of battery testing or arbitrary use. SRE parameters include a rate constant (sometimes referred to herein as "a"), an order of a reaction (sometimes referred to herein as "b"), and a maximum extent of aging (sometimes referred to herein as "M"). The SRE parameters may be referred to herein collectively as "(a, b, and M)," "(a, b, M)," or "(a,b,M)." For example, the following is an example of an SRE for a single aging mechanism:

$$\psi(i, i^*, t) = \left\{ (1 - \theta t(i, i^*)) \stackrel{!}{=} M_i' + 2(M_i - M_i') \left[ \frac{1}{2} - \frac{1}{1 + \exp\left((a_i t)^{b_i}\right)} \right] \right\}$$

And, the following is an example of an SRE for multiple aging mechanisms:

$$\sum_i^Z \psi(i, i^*, t) =$$

$$\left\{ \sum_i^Z (1 - \theta t(i, i^*)) \stackrel{!}{=} \sum_i^Z \left( M_i' + 2(M_i - M_i') \left[ \frac{1}{2} - \frac{1}{1 + \exp\left((a_i t)^{b_i}\right)} \right] \right) \right\}$$

In addition to predictive capabilities, the SRE evaluations allow for diagnostic insights for how the material-driven aging responses varied with chemistry and the chosen test conditions. The parameters (a,b,M) (and (c,d,N) where applicable for another aging mechanism) may be used as a diagnostic thumbprint based on chemical kinetics and thermodynamics, making the parameters suitable to support materials diagnostics and design optimization. For example, it may be desirable to have (a,M) terms be relatively low, denoting a slow degradation process and a low maximum extent of degradation. Thus, (a,b,M) can be tracked over a design matrix to identify optimal design-to-aging outcomes. Also, the SRE parameters themselves could be directly incorporated into a ML framework that would extend this approach to off-matrix design features and test conditions.

Some embodiments use extrapolative techniques using specialized functions to determine SRE parameter convergence. These or other techniques may use converged SRE parameters to predict an aging state of a battery (e.g., a future capacity, a loss of active material and/or a loss of lithium inventory) of a battery. Embodiments using extrapolative techniques are illustrated and described with regard to FIG. 1, FIG. 3, and FIG. 4.

Some embodiments use a technique based on a machine-learning model and/or a Monte Carlo (MC) framework. These or other techniques may use a trained machine-learning model (e.g., a deep learning (DL) model) to predict an aging state (e.g., a future capacity) of a battery. Embodiments related to training a machine-learning model are illustrated and described with regard to FIG. 5 and FIG. 6. Embodiments related to using a machine-learning model (e.g., a machine-learning model trained according to any of the embodiments disclosed herein) to predict an aging state of a battery are illustrated and described with regard to FIG. 7.

Figure 8:
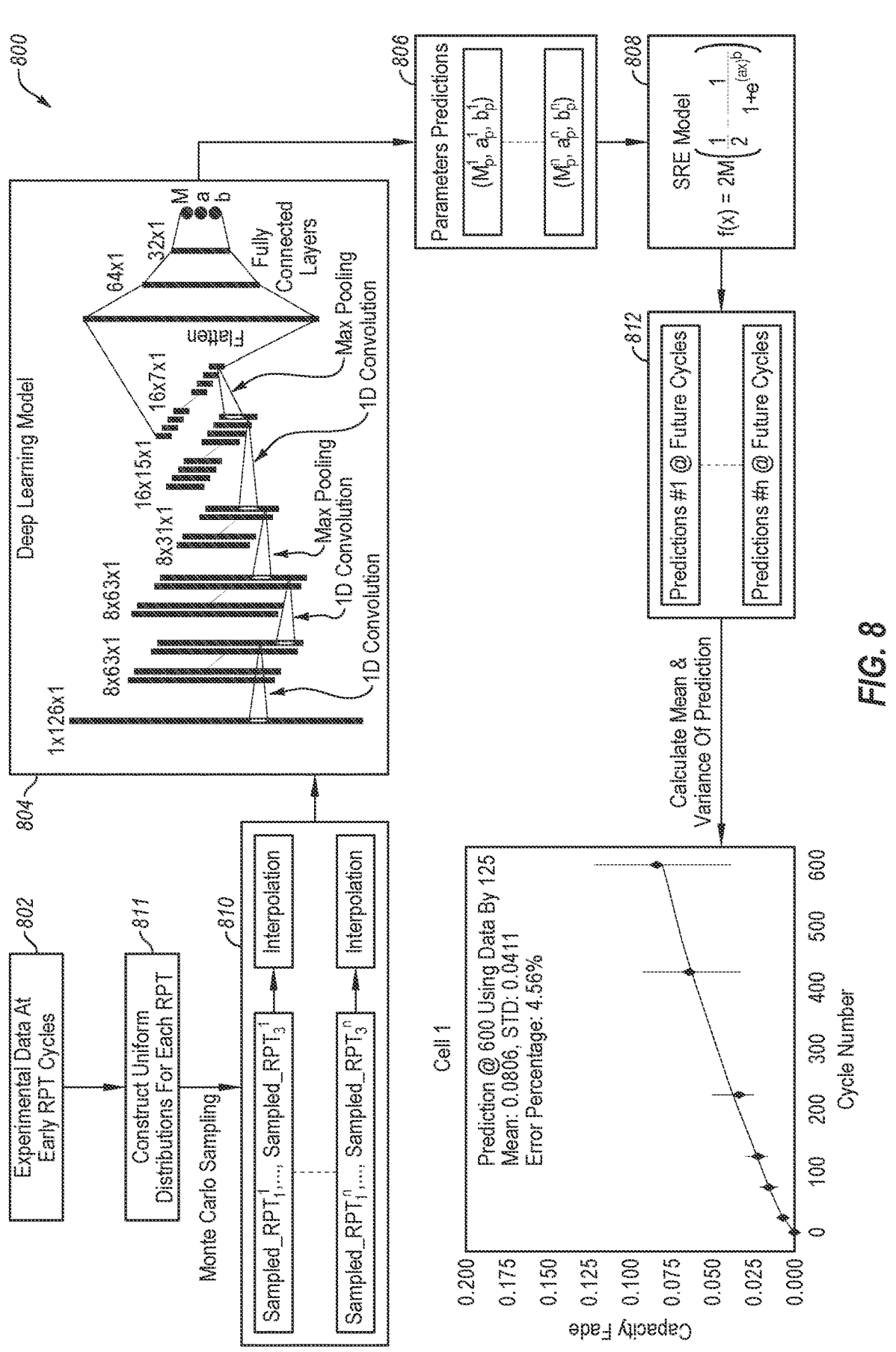
FIG. 8 depicts a Monte Carlo-based deep learning prediction framework, according to various embodiments of the disclosure.

Embodiments related to additional actions that may be taken based on a predicted aging state (e.g., an aging state predicted according to any of the embodiments disclosed herein) are illustrated and described with regard to FIG. 8. Embodiments related to a method for determining initial SRE parameters based on a relationship between SRE parameters derived from recent measurements and historical SRE parameters based on historical measurements are illustrated and described with regard to FIG. 10.

The embodiments described herein are described with relation to a battery. The embodiments may equally relate to and/or be used with regard to one or more cells of a battery individually or collectively. For example, embodiments may be employed with relation to individual cells, groups of cells collectively, groups of cells considered individually, or batteries composed of one or more cells. In other words, the embodiments may apply to assemblages of cells that are electronically connected in series, parallel, or mixed configuration. Capacity measurements may follow a linear dependence on the number of cells per assembly.

Figure 5:
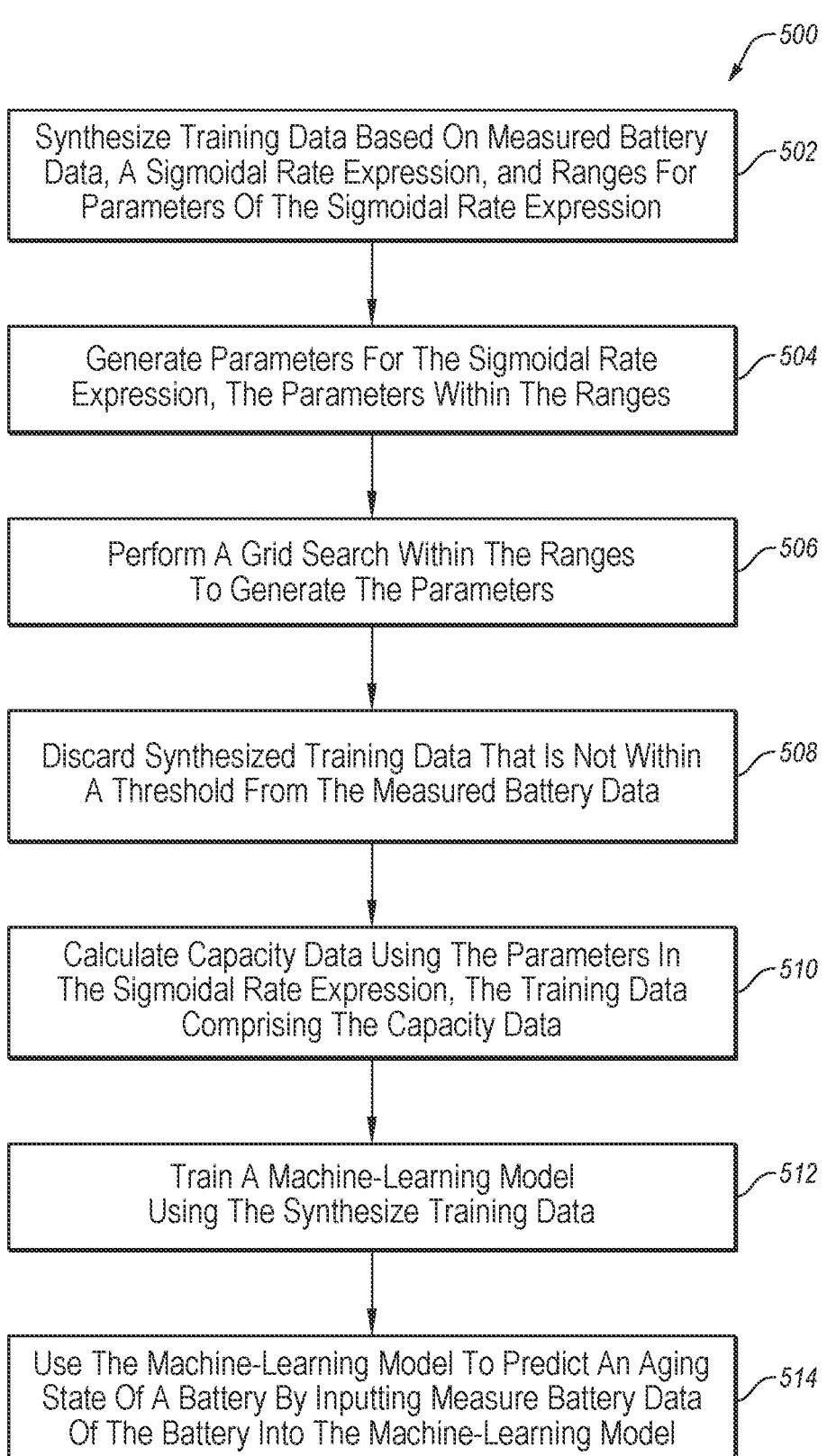
FIG. 5 is a flowchart of an example method, in accordance with various embodiments of the disclosure.

Embodiments described herein generally relate to predicting an aging state based on a single aging mechanism (e.g., using a single SRE corresponding to the single aging mechanism). However, embodiments may be performed with respect to multiple mechanisms (e.g., multiple different aging mechanisms) using a corresponding number of SRE expressions. FIG. 3 and FIG. 5 illustrate examples of predictive methods using two SREs corresponding to two aging mechanisms.

A predicted aging state of a battery may include one or more predicted capacity values at one or more cycles in the future. For examples, capacity (and/or resistance or conductance) of a battery may be measured after ten, twenty, and thirty cycles. The predicted aging state of the battery may include predictions of what the capacity (and/or resistance or conductance) of the battery will be after fifty, one hundred, two hundred, or three hundred cycles.

FIG. 1 is a flowchart of an example method 100, in accordance with various embodiments of the disclosure. At least a portion of method 100 may be performed, in some embodiments, by a device or system, such as device 1200 of FIG. 12, or another device or system. Although illustrated as discrete blocks, various blocks may be divided into additional blocks, combined into fewer blocks, or eliminated, depending on the desired implementation.

At block 102, two or more points of data (e.g., capacity-loss data) may be obtained. The data may be obtained early in the battery's life cycle e.g., during the first one hundred charging cycles. The data may be reference performance test (RPT) data obtained periodically during early-life cycling (e.g., once every 2 to 4 weeks), and/or data interpolated from RPT data. The data may be obtained under conditions that do not incur significant polarization effects.

At block 104, interpolative/extrapolative mathematical functions may be applied to synthesize data (e.g., capacity-loss data). The synthesized data may fit between data points of the data obtained at block 102. The choice of the interpolative/extrapolative mathematical functions may be based on characteristics of the data of block 102. Additionally or alternatively, the interpolative/extrapolative mathematical functions may be customized for the SRE parameters to be obtained at block 106. For example, a spline interpolation operation may be used at block 104.

At block 106, a regression may be performed on a sigmoidal rate expression (SRE) using data (e.g., including the synthesized data of block 104) to obtain SRE parameters (e.g., (a,b,M)). The SRE parameters may represent SRE parameters at different points of progression of time or cycle count. As an example, a non-linear least squares method (e.g., Levenberg-Marquardt algorithm) may be used at block 106.

At block 108, individual plots of SRE parameters (e.g., a, b, and M) (e.g., the SRE parameters obtained at block 106) may be plotted. The SRE parameters may be plotted over different points of progression of time or cycle count to ascertain convergence behavior of the SRE parameters (e.g., to determine convergent values for a, b and M using the RPT data). In most cells, logarithmic and exponential trends are observed in three or four sets of SRE parameters. Trendline equations for each SRE parameter may be derived.

At block 110, battery aging may be predicted (e.g., based on the plots of block 108). The aging may be predicted over an extended time or cycle count by implementing the determined set of (a,b,M) within an SRE expression.

Examples provided herein generally relate to predicting aging based on a single aging mechanism (e.g., using a single SRE corresponding to the single aging mechanism). However, the method would allow for multiple mechanisms (e.g., multiple different aging mechanisms) with a corresponding number of SRE expressions, SRE parameters, and plots.

FIG. 2 illustrates a curve-fitting (CF) method 200, in accordance with various embodiments of the disclosure. Some embodiments may include analytical-based extrapolation methods using specialized functions. For example, a general predictive CF method may involve five components: 1) early-time RPT data (e.g., capacity loss) of at least three points; 2) applying specialized interpolative/extrapolative mathematical functions that synthesize numerous capacity loss data in between and past RPT data points of component 1; 3) using the outcome of component 2 (e.g., at different progression of time or cycle count) to perform SRE regression to obtain SRE parameters (a,b,M) at different points of progression of time or cycle count; 4) plotting the individual plots of a, b and M gained from component 3 over different points of progression of time or cycle count to ascertain convergence behavior of these terms (e.g., to determine convergent values for a, b and M using minimal RPT data); and 5) utilizing the outcome of component 4 to predict battery aging over extended time or cycle count by implementing the determined set of (a,b,M) within an SRE expression.

This approach may be demonstrated by using a single SRE that would denote a single dominating aging mechanism, yet it is noted that that a generalized application may allow for multiple mechanisms with a corresponding number of SRE expressions. The choice of the special functions in component 2 may be for demonstration purposes and is arbitrary, as some forms may provide better extrapolative behavior for particular datasets. These special functions can be customized toward particular SRE parameters. Further, it is noted that datasets outside of RPT conditions could serve for component 1 provided the data is obtained under conditions that do not incur significant polarization effects.

Based on this general approach, the following describes a case with particular elements of application. This method incorporates an SRE model with curve fitting to predict capacity loss and loss of lithium inventory (LLI) at the end of test (EOT) condition. Three SRE parameters (a, b, M) representing entire aging trends (i.e., from beginning to EOT) are predicted via curve fitting at the early stage of cycling and used to predict capacity and LLI at EOT.

Initially, SRE parameters $(a, b, M)_n$ are calculated based on $RPT_0$-$RPT_i$ (i=n+1) using the curve fitting method. It is noted that $(a, b, M)_1$ are SRE parameters that may best represent aging trends between $RPT_0$ and $RPT_2$, and (a, b, $M)_2$ is based on the trends between $RPT_0$ and $RPT_3$. The parameters are limited according to the general ranges of parameters (a, b, M) of the SRE model. In the non-linear least squares method (e.g., Levenberg-Marquardt algorithm) from extensive library SciPy available in Python may be employed. This may require at least three data points to derive fitting parameters, and fitting performance may be improved by including more data points via component 2 above. Thus, capacity and LLI at every cycle number are estimated with the spline interpolation operation using the capacity and LLI at each RPT.

Further, a set of a, b, and Mat EOT is predicted based on the trends in each parameter. In most cells, logarithmic and exponential trends are observed in three or four sets of SRE parameters, which require five and six RPT data, including $RPT_0$, as shown in FIG. 2. Trendline equations for each SRE parameter may be derived (e.g., using a spreadsheet). After obtaining SRE parameters (a, b, M) at EOT, capacity and LLI are predicted using the SRE equation shown in FIG. 2.

FIG. 3 is a flowchart of an example method 300, in accordance with various embodiments of the disclosure. At least a portion of method 300 may be performed, in some embodiments, by a device or system, such as device 1200 of FIG. 12, or another device or system. Although illustrated as discrete blocks, various blocks may be divided into additional blocks, combined into fewer blocks, or eliminated, depending on the desired implementation.

At block 302, a first capacity of a battery after a first cycle of the battery may be measured at a first time. The first cycle may include one or both of a charge and discharge of the battery. For example, the cycle may include a first full charge followed by a full discharge or a full discharge followed by a full charge. Additionally or alternatively, conductance or resistance of the battery may be measured at the first time. The first capacity measurements of the battery may be taken following a slow charge and/or a slow discharge of the battery. In some cases, the slow charge may follow, or be followed by, a slow discharge. The first capacity measurements may be scheduled after a certain period of life of the battery and/or after a certain number of charge cycles.

At block 304, a second capacity of the battery after a second cycle of the battery may be measured at a second time. The second cycle may be a charge and/or discharge similar to the first cycle. Additionally or alternatively, conductance or resistance of the battery may be measured at the second time. The second capacity measurements of the battery may be taken following a slow charge and/or a slow discharge of the battery. In some cases, the slow charge may follow, or be followed by, a slow discharge. The second capacity measurements may be scheduled after a certain period of life of the battery and/or after a certain number of charge cycles (e.g., a certain number of charge cycles after the first capacity measurements). For example, there may be sufficient time between the first time and the second time to have produced an aging artifact of diminished battery capacity, and likewise for conductance loss and power fade.

At block 306, measured data based on the first capacity and the second capacity may be generated. The measured data may include one or more of: capacity-loss data comprising discharge-capacity measurements of the battery at two or more times, conductance-loss data comprising conductance or resistance measurements of the battery at two or more times, and power-fade data comprising power measurements of the battery at two or more times.

At block 308, historical parameters of a sigmoidal rate expression may be generated based on the sigmoidal rate expression and the measured data of the battery. The historical parameters may include one or more of: a rate constant, an order of a reaction; and a maximum extent of aging. The sigmoidal rate expression may be related to a loss of lithium inventory or a loss of active electrode material (LAM).

At block 310, curve fitting may be applied to the sigmoidal rate expression including the measured data to obtain the historical parameters.

At block 312, it may be determined that the historical parameters have converged by comparing the historical parameters to a threshold.

At block 314, future parameters of the sigmoidal rate expression may be predicted based on the sigmoidal rate expression and the historical parameters. The future parameters may include one or more of: a rate constant, an order of a reaction; and a maximum extent of aging.

At block 316, an aging state of the battery may be predicted based on the sigmoidal rate expression and the future parameters.

At block 318, the sigmoidal rate expression including the historical parameters may be extrapolated to obtain the future parameters.

At block 320, the aging state may be calculated from the sigmoidal rate expression including the future parameters.

FIG. 4 is a flowchart of an example method 400, in accordance with various embodiments of the disclosure. At least a portion of method 400 may be performed, in some embodiments, by a device or system, such as device 1200 of FIG. 12, or another device or system. Although illustrated as discrete blocks, various blocks may be divided into additional blocks, combined into fewer blocks, or eliminated, depending on the desired implementation.

At block 402, first historical parameters of a first sigmoidal rate expression may be generated based on the first sigmoidal rate expression and measured data of a battery. The first historical parameters may include one or more of: a rate constant, an order of a reaction; and a maximum extent of aging. The first sigmoidal rate expression may be related to one of a loss of lithium inventory or a loss of active electrode material.

At block 404, second historical parameters of a second sigmoidal rate expression may be generated based on the second sigmoidal rate expression and the measured data. The second historical parameters may include one or more of: a rate constant, an order of a reaction; and a maximum extent of aging. The second sigmoidal rate expression may be related to the other of a loss of lithium inventory or a loss of active electrode material.

At block 406, future parameters of the first sigmoidal rate expression may be predicted based on the first sigmoidal rate expression and the first historical parameters. The future parameters may include one or more of: a rate constant, an order of a reaction; and a maximum extent of aging.

At block 408, second future parameters of the second sigmoidal rate expression may be predicted based on the second sigmoidal rate expression and the second historical parameters. The future parameters may include one or more of: a rate constant, an order of a reaction; and a maximum extent of aging.

At block 410, an aging state of the battery may be predicted based on the first sigmoidal rate expression, the first future parameter, the second sigmoidal rate expression, and the second future parameters.

FIG. 5 is a flowchart of an example method 500, in accordance with various embodiments of the disclosure. At least a portion of method 500 may be performed, in some embodiments, by a device or system, such as device 1200 of FIG. 12, or another device or system. Although illustrated as discrete blocks, various blocks may be divided into additional blocks, combined into fewer blocks, or eliminated, depending on the desired implementation.

At block 502, training data is synthesized based on measured battery data, a sigmoidal rate expression, and ranges for parameters of the sigmoidal rate expression. The measured battery data may include one or more of: capacity-loss data comprising discharge-capacity measurements of a battery at two or more times, conductance-loss data comprising conductance measurements of the battery at two or more times, and power-fade data comprising power measurements of the battery at two or more times. The ranges for parameters comprise ranges of suitable values for parameters of the sigmoidal rate expression. The parameters may include one or more of: a rate constant, an order of reaction, and a maximum extent of aging. The sigmoidal rate expression may be related to a loss of lithium inventory or a loss of active electrode material.

At block 504, parameters for the sigmoidal rate expression may be generated. The parameters may be within the ranges.

At block 506, a grid search within the ranges may be performed to generate the parameters.

At block 508, synthetized training data that is not within a threshold from the measured battery data may be discarded. For example, synthesized-training-data samples that are not within the threshold from the measured battery data may be discarded from the synthesized training data.

At block 510, capacity data may be calculated using the parameters in the sigmoidal rate expression, the training data comprising the capacity data.

At block 512, a machine-learning model may be trained using the synthesized training data. The machine-learning model may be a convolutional neural network. The convolutional neural network may have many layers, e.g., the convolutional neural network may be a deep-learning convolutional neural network.

At block 514, the machine-learning model may be used to predict an aging state of a battery by inputting measured battery data of the battery into the machine-learning model. The measured battery data used at block 514 may be different from (e.g., from a different battery than) the measured battery data used to generate the synthesized data at block 502.

An accelerated battery life prediction framework is developed by combining the physics-based simulation using Sigmoidal Rate Expression (SRE) model and Deep Learning (DL) technology. This framework provides an approach which integrates the experimental data, simulations, physics-based models, and deep learning together to predict battery life with early cycle data.

In this framework, the training of a ML model (e.g., a deep-learning prediction model) uses synthetic data, which is generated by following an experimental-data-informed generation process. The experimental-data-informed generation process uses the inputs of general ranges of parameters in SRE model from prior physical knowledge and the information for experimental data at early RPT cycles. According to general ranges of parameters (a, b, M) of SRE model, a grid search method may be applied to generate various combinations of (a, b, M), which are fed into SRE model to calculate data at specific cycles. The known experimental data at early cycles is utilized to ensure the synthetic data will align the degradation behavior at early cycles which already happened. For example, the simulated data which is not within given thresholds at early cycles will be discarded.

The synthetic data generation process creates a physically meaningful simulated dataset using a small amount of experimental data, which will make the training process of the ML model (e.g., a DL model) more efficient. The utilization of synthetic data on the ML training process (e.g., the ML training process) may allow an ML model (e.g., a DL model) to be trained using less experimental data than may be used in other training techniques, which may render the application of ML methods (e.g., DL methods) to battery life prediction feasible.

Figure 6:
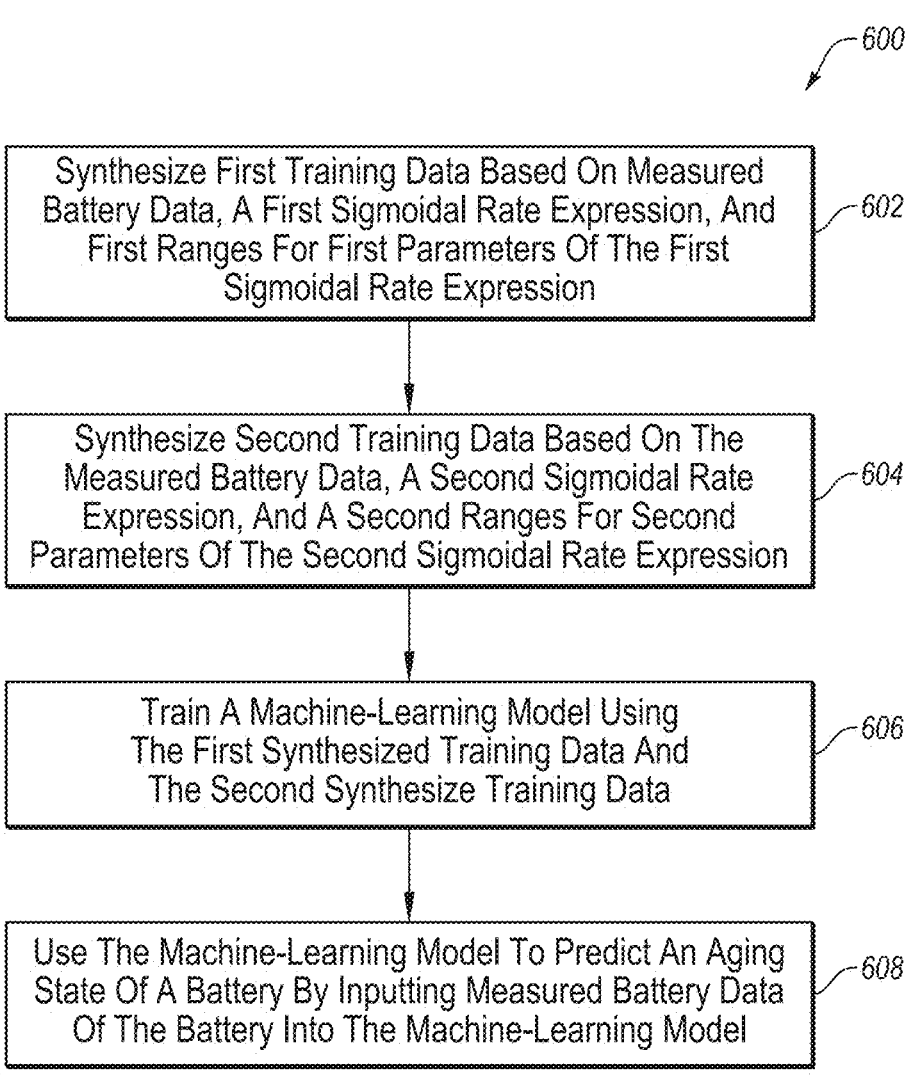
FIG. 6 is a flowchart of an example method, in accordance with various embodiments of the disclosure.

FIG. 6 is a flowchart of an example method 600, in accordance with various embodiments of the disclosure. At least a portion of method 600 may be performed, in some embodiments, by a device or system, such as device 1200 of FIG. 12, or another device or system. Although illustrated as discrete blocks, various blocks may be divided into additional blocks, combined into fewer blocks, or eliminated, depending on the desired implementation.

At block 602, first training data may be synthesized based on measured battery data, a first sigmoidal rate expression, and first ranges for first parameters of the first sigmoidal rate expression. The measured battery data may include one or more of: capacity-loss data comprising discharge-capacity measurements of a battery at two or more times, conductance-loss data comprising conductance measurements of the battery at two or more times, and power-fade data comprising power measurements of the battery at two or more times. The first ranges for parameters comprise ranges of suitable values for the first parameters of the first sigmoidal rate expression. The first parameters may include one or more of: a rate constant, an order of reaction, and a maximum extent of aging. The first sigmoidal rate expression may be related to a loss of lithium inventory or a loss of active electrode material.

At block 604, second training data may be synthesized based on the measured battery data, a second sigmoidal rate expression, and second ranges for second parameters of the second sigmoidal rate expression. The second ranges for parameters comprise ranges of suitable values for the second parameters of the second sigmoidal rate expression. The second parameters may include one or more of: a rate constant, an order of reaction, and a maximum extent of aging. The second sigmoidal rate expression may be related to the other of a loss of lithium inventory or a loss of active electrode material.

At block 606, a machine-learning model may be trained using the first synthesized training data and the second synthesized training data.

At block 608, the machine-learning model may be used to predict an aging state of a battery by inputting measured battery data of the battery into the machine-learning model. The measured battery data used at block 608 may be different from (e.g., from a different battery than) the measured battery data used to generate the synthesized data at block 602 and block 604.

FIG. 7 is a flowchart of an example method 700, in accordance with various embodiments of the disclosure. At least a portion of method 700 may be performed, in some embodiments, by a device or system, such as device 1200 of FIG. 12, or another device or system. Although illustrated as discrete blocks, various blocks may be divided into additional blocks, combined into fewer blocks, or eliminated, depending on the desired implementation.

At block 702, measured battery data may be conditioned by interpolating between data points of the measured battery data and/or by extrapolating additional data points. The measured battery data may include one or more of: capacity-loss data comprising discharge-capacity measurements of a battery at two or more times, conductance-loss data comprising conductance measurements of the battery at two or more times, and power-fade data comprising power measurements of the battery at two or more times. The interpolative/extrapolative mathematical functions used at block 702 may be based on characteristics of the data. Additionally or alternatively, the interpolative/extrapolative mathematical functions used at block 702 may be customized for the SRE parameters to be obtained at block 704. For example, a spline interpolation operation may be used at block 702.

At block 704, future parameters of a sigmoidal rate expression may be generated by inputting the measured battery data of a battery into a machine-learning model. The machine-learning model may have been trained through a method substantially similar to or the same as method 600 of FIG. 6 or another method. The machine-learning model may have been trained using synthesized training data based on the measured battery data, the sigmoidal rate expression, and ranges for parameters of the sigmoidal rate expression.

At block 706, an aging state of the battery may be calculated from the sigmoidal rate expression including the future parameters.

At block 708, perturbed battery data may be generated based on the measured battery data.

At block 710, random values may be added to the measured battery data to generate the perturbed battery data of block 708. The random values may be positive or negative.

At block 712, the random values of block 710 may be generated using the measured battery data as a mean value of one or both of a uniform distribution or a normal distribution.

At block 714, the perturbed battery data may be conditioned by interpolating between data points of the perturbed battery data and/or by extrapolating additional data points from the data points of the perturbed data.

At block 716, perturbed future parameters of the sigmoidal rate expression may be generated by inputting the perturbed battery data into the machine-learning model.

At block 718, perturbed aging-state data may be calculated from the sigmoidal rate expression including the perturbed future parameters.

At block 720, confidence metrics regarding the aging state may be generated based on a relationship between the aging state and the perturbed aging-state data.

With reference to FIG. 8, which depicts a Monte Carlo-based DL prediction framework 800, a Monte Carlo-based DL prediction process is described. A Monte Carlo-based DL prediction process is developed to predict the capacity fade or loss of lithium inventory (LLI) at later cycles. The inputs of the prediction process are experimental data 802 of capacity fade or LLI at early RPT cycles and a trained model (e.g., DL model) 804 to estimate parameters 806 in an SRE model 808.

By combining the Monte Carlo simulation technique, each given experimental data point serves as the mean value of a uniform distribution or a normal distribution. The variance of constructed input distributions is selected to represent the uncertainties or perturbation on given experimental inputs. By sampling (e.g., via block 810) the constructed distributions (e.g., see block 811), several groups of perturbed experimental RPT data are generated.

Before feeding several groups of perturbed experimental RPT data into trained model 804, the interpolation operation is applied to several groups of perturbed experimental RPT data to make the input have the information at each cycle (e.g., the data array with RPT cycle 0, 25, 75, 125 (a vector with dimension 4×1) may be interpolated to a data array with information at each cycle, i.e., a vector with dimension (126×1)).

Model 804 (e.g., trained using synthetic data) may take the experimental input data to predict values of parameters (a, b, M). Each generated input from Monte Carlo simulation may create a prediction on these three parameters.

Utilizing predicted parameters 806, the corresponding SRE models 808 are established so that the capacity fade information in the future cycles can be inferred from the SRE-based prediction models.

For a given future cycle, e.g., cycle 450, multiple predictions (e.g., at block 812) on capacity fade or LLI may be derived. From these predictions, a mean value and standard deviation may be calculated, which stand for the mean prediction on capacity fade or LLI and its prediction uncertainties. Thus, the approach will not only provide the mean values on the target prediction, but also may model the uncertainties on predictions. The uncertainties may be valuable to describe the confidence on predictions for future battery life. Therefore, due to the combination of simulations, physics-based model and DL technologies, this approach may reduce the need for experimental data to predict battery life. This accelerates battery life prediction by utilizing very early cycle testing data.

The methods above demonstrate that high-fidelity prediction of EOT capacity loss can be obtained through accelerated determination of the SRE (a,b,M) parameters. This outcome may be captured for aging pathways along constant test conditions that are dependent on one dominant mechanism such as LLI. Other mathematical considerations can be invoked if more than one mechanism is suspected and if test conditions vary along the timeline to produce path-dependent aging.

Figure 9:
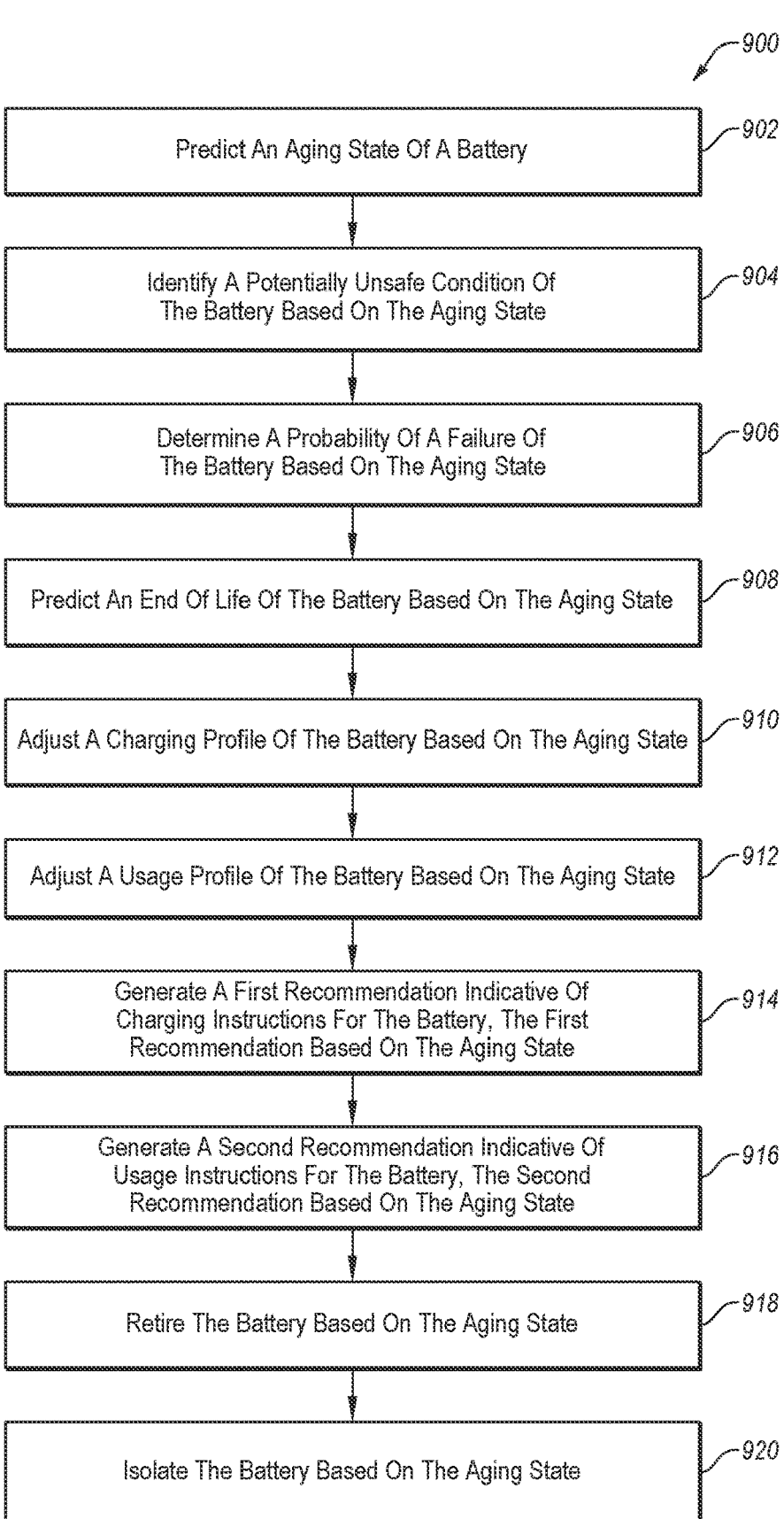
FIG. 9 is a flowchart of an example method, in accordance with various embodiments of the disclosure.

FIG. 9 is a flowchart of an example method 900, in accordance with various embodiments of the disclosure. At least a portion of method 900 may be performed, in some embodiments, by a device or system, such as device 1200 of FIG. 12, or another device or system. Although illustrated as discrete blocks, various blocks may be divided into additional blocks, combined into fewer blocks, or eliminated, depending on the desired implementation.

At block 902, an aging state of a battery may be predicted. The aging state may be predicted using a method substantially similar to or the same as any of method 100 of FIG. 1, method 300 of FIG. 3, method 400 of FIG. 4, method 500 of FIG. 5, method 700 of FIG. 7, or another method.

At block 904, a potentially unsafe condition of the battery may be identified based on the aging state.

At block 906, a probability of a failure of the battery may be determined based on the aging state.

At block 908, an end of life of the battery may be predicted based on the aging state.

At block 910, a charging profile of the battery may be adjusted based on the aging state. The charging profile may include proscribed environmental conditions.

At block 912, a usage profile of the battery may be adjusted based on the aging state. The usage profile may include proscribed environmental conditions.

At block 914, a first recommendation indicative of charging instructions for the battery may be generated based on the aging state. The charging instructions may include proscribed environmental conditions.

At block 916, a second recommendation indicative of usage instructions for the battery may be generated based on the aging state. The usage instructions may include proscribed environmental conditions.

At block 918, the battery may be retired based on the aging state.

At block 920, the battery may be isolated based on the aging state.

FIG. 10 is a flowchart of an example method 1000, in accordance with various embodiments of the disclosure. At least a portion of method 1000 may be performed, in some embodiments, by a device or system, such as device 1200 of FIG. 12, or another device or system. Although illustrated as discrete blocks, various blocks may be divided into additional blocks, combined into fewer blocks, or eliminated, depending on the desired implementation.

At block 1002, a first capacity of a first battery may be measured after a first cycle (e.g., a first charge and/or first discharge) of the first battery at a first time. The first cycle may include a first full charge and/or a first full discharge of the battery. In cases in which the first cycle includes a charge and a discharge, the charge may follow, or be followed by the discharge.

At block 1004, first conditions relative to the usage of the first battery before the first time may be recorded.

At block 1006, a second capacity of the first battery may be measured after a second cycle (e.g., a second charge and/or a second discharge) of the first battery at a second time. The second cycle may include a second full charge and/or a second full discharge of the battery. In cases in which the second cycle includes a charge and a discharge, the charge may follow, or be followed by the discharge.

At block 1008, second conditions relative to the usage of the first battery between the first time and the second time may be recorded.

At block 1010, curve fitting may be applied to a sigmoidal rate expression including the first capacity and the second capacity to obtain first historical parameters. In some cases, the curve fitting may be applied to the sigmoidal rate expression including one or more additional capacities, which additional capacities may have been obtained through operations analogous to that of blocks 1002 and/or 1006.

At block 1012, second historical parameters of a second battery may be predicted based on a relationship between third conditions of the second battery and both of the first conditions and the second conditions.

Modifications, additions, or omissions may be made to any of method 300 of FIG. 3, method 400 of FIG. 4, method 100 of FIG. 1, method 500 of FIG. 5, method 600 of FIG. 6, method 700 of FIG. 7, method 900 of FIG. 9, and method 1000 of FIG. 10 without departing from the scope of the present disclosure. For example, the operations of method 200, method 400, method 100, method 500, method 600, method 700, method 900, and/or method 1000 may be implemented in differing order. Furthermore, the outlined operations and actions are only provided as examples, and some of the operations and actions may be optional, combined into fewer operations and actions, or expanded into additional operations and actions without detracting from the essence of the disclosed example.

FIGS. 11*a*-11*f* depicts various results associated with Deep Learning (DL) and curve fitting (CF), according to various embodiments of the disclosure. More specifically, FIGS. 11*a*-11*c* depict absolute capacity prediction errors (%), and FIGS. 11*d*-11*f* depict absolute loss of lithium inventory (LLI) prediction errors (%) in different loading cells (P492—Low Loading and P462/P533—moderate loading) under different charging conditions including cycling (C) rates (1C-9C), charging protocols (CCCV (constant current constant voltage)), MS (multi-step).

Figure 12:
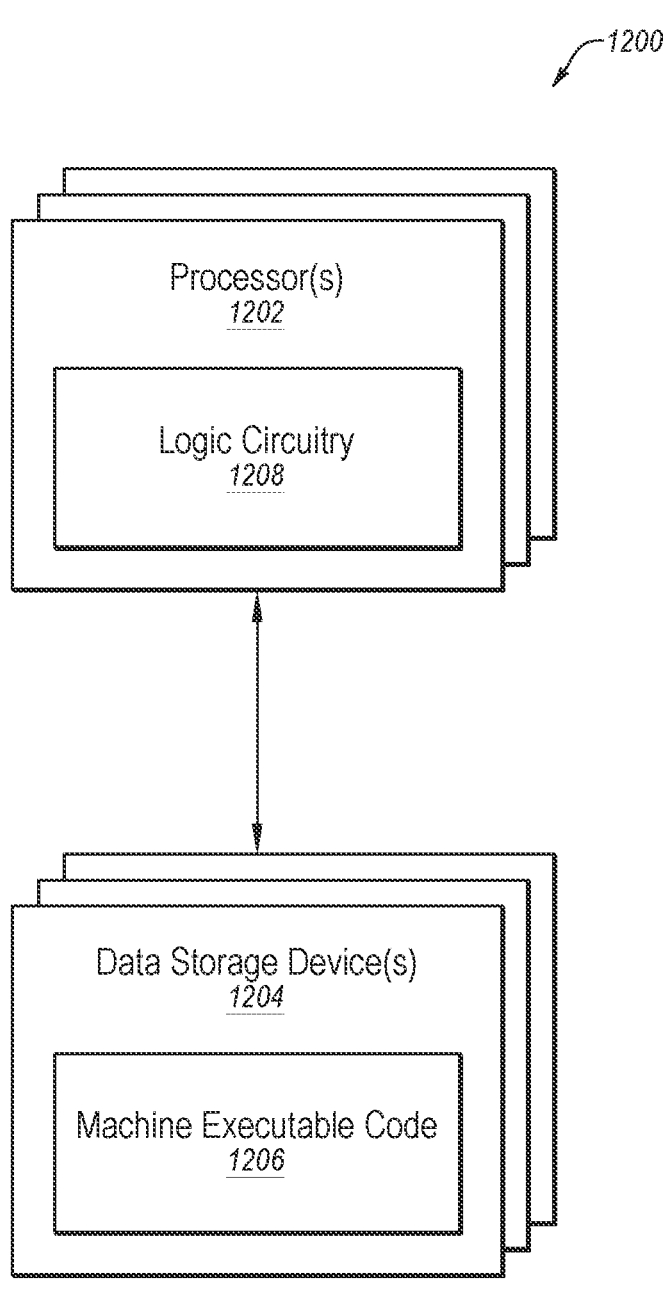
FIG. 12 illustrates a block diagram of an example device that may be used to implement various functions, operations, acts, processes, and/or methods, in accordance with one or more embodiments.

FIG. 12 is a block diagram of an example device 1200 that, in various embodiments, may be used to implement various functions, operations, acts, processes, and/or methods disclosed herein. Device 1200 includes one or more processors 1202 (sometimes referred to herein as "processors 1202") operably coupled to one or more apparatuses such as data storage devices (sometimes referred to herein as "storage 1204"), without limitation. Storage 1204 includes machine-executable code 1206 stored thereon (e.g., stored on a computer-readable memory) and processors 1202 include logic circuitry 1208. Machine-executable code 1206 includes information describing functional elements that may be implemented by (e.g., performed by) logic circuitry 1208. Logic circuitry 1208 is adapted to implement (e.g., perform) the functional elements described by machine-executable code 1206. Device 1200, when executing the functional elements described by machine-executable code 1206, should be considered as special purpose hardware configured for carrying out the functional elements disclosed herein. In various embodiments, processors 1202 may be configured to perform the functional elements described by machine-executable code 1206 sequentially, concurrently (e.g., on one or more different hardware platforms), or in one or more parallel process streams.

When implemented by logic circuitry 1208 of processors 1202, machine-executable code 1206 is configured to adapt processors 1202 to perform operations of embodiments disclosed herein. For example, machine-executable code 1206 may be configured to adapt processors 1202 to perform at least a portion or a totality of method 300 of FIG. 3, method 400 of FIG. 4, method 100 of FIG. 1, method 500 of FIG. 5, method 600 of FIG. 6, method 700 of FIG. 7, method 900 of FIG. 9, and method 1000 of FIG. 10.

Processors 1202 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute computing instructions (e.g., software code) related to embodiments of the present disclosure. It is noted that a general-purpose processor (may also be referred to herein as a host processor or simply a host) may be a microprocessor, but in the alternative, processors 1202 may include any conventional processor, controller, microcontroller, or state machine. Processors 1202 may also be implemented as a combination of computing devices, such as a combination of a DSP and a microprocessor, a plurality of microprocessors, one or more microprocessors in conjunction with a DSP core, or any other such configuration.

In some embodiments, storage 1204 includes volatile data storage (e.g., random-access memory (RAM)), non-volatile data storage (e.g., Flash memory, a hard disc drive, a solid state drive, erasable programmable read-only memory (EPROM), without limitation). In some embodiments, processors 1202 and storage 1204 may be implemented into a single device (e.g., a semiconductor device product, a system on chip (SOC), without limitation). In some embodiments, processors 1202 and storage 1204 may be implemented into separate devices.

In some embodiments, machine-executable code 1206 may include computer-readable instructions (e.g., software code, firmware code). By way of non-limiting example, the computer-readable instructions may be stored by storage 1204, accessed directly by processors 1202, and executed by processors 1202 using at least logic circuitry 1208. Also by way of non-limiting example, the computer-readable instructions may be stored on storage 1204, transmitted to a memory device (not shown) for execution, and executed by processors 1202 using at least logic circuitry 1208. Accordingly, in some embodiments logic circuitry 1208 includes electrically configurable logic circuitry.

In some embodiments, machine-executable code 1206 may describe hardware (e.g., circuitry) to be implemented in logic circuitry 1208 to perform the functional elements. This hardware may be described at any of a variety of levels of abstraction, from low-level transistor layouts to high-level description languages. At a high-level of abstraction, a hardware description language (HDL) such as an Institute of Electrical and Electronics Engineers (IEEE) Standard hardware description language (HDL) may be used, without limitation. By way of non-limiting examples, VERILOG™, SYSTEMVERILOG™ or very large scale integration (VLSI) hardware description language (VHDL™) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of logic circuitry 1208 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some embodiments, machine-executable code 1206 may include an HDL, an RTL, a GL description, a mask level description, other hardware description, or any combination thereof.

In some embodiments, where machine-executable code 1206 includes a hardware description (at any level of abstraction), a system (not shown, but including storage 1204) may be configured to implement the hardware description described by machine-executable code 1206. By way of non-limiting example, processors 1202 may include a programmable logic device (e.g., an FPGA or a PLC) and the logic circuitry 1208 may be electrically controlled to implement circuitry corresponding to the hardware description into logic circuitry 1208. Also by way of non-limiting example, logic circuitry 1208 may include hard-wired logic manufactured by a manufacturing system (not shown, but including storage 1204) according to the hardware description of machine-executable code 1206.

Regardless of whether machine-executable code 1206 includes computer-readable instructions or a hardware description, logic circuitry 1208 is adapted to perform the functional elements described by machine-executable code 1206 when implementing the functional elements of machine-executable code 1206. It is noted that although a hardware description may not directly describe functional elements, a hardware description indirectly describes functional elements that the hardware elements described by the hardware description are capable of performing.

Various embodiments disclosure herein are disclosed with reference to SRE. However, the disclosure is not restricted to SRE-type equations, as there are other forms of rate equations that could be surrogates for SRE, provided they encompass the same type of kinetic and thermodynamic information within their parameters. The same methods may still apply toward accelerated determination of parameters for such non-SRE forms.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

Although the context of embodiments of the present disclosure is described as generally applying to a battery, and in particular, a lithium-ion battery and/or a lithium-metal battery, the present disclosure is not to be viewed as so limited. For example, it is contemplated that the methodology described herein may be used in estimating aging consequences of arbitrary aging conditions for objects in the field of electronics or electrochemistry.

In the present disclosure, the terms "battery," "cell," and "cells" include one or more cells that produces electric energy including e.g., a lithium-ion-battery cell and/or a lithium-metal-battery cell. In some embodiments, a battery may include rechargeable cells, fuel cells, and other cells that use an electrochemical reaction to produce electric energy, and combinations thereof. In addition, although batteries having lithium-ion cells are primarily discussed herein, other types of batteries may be used and analyzed according to embodiments of the present disclosure.

While the present disclosure has been described herein with respect to certain illustrated some embodiments, those of ordinary skill in the art will recognize and appreciate that the present invention is not so limited. Rather, many additions, deletions, and modifications to the illustrated and described some embodiments may be made without departing from the scope of the invention as hereinafter claimed along with their legal equivalents. In addition, features from one some embodiment may be combined with features of another some embodiment while still being encompassed within the scope of the invention as contemplated by the inventor.

What is claimed is:

1. A method comprising:
generating historical parameters of a sigmoidal rate expression based on the sigmoidal rate expression and measured data of a battery;
predicting future parameters of the sigmoidal rate expression based on the sigmoidal rate expression and the historical parameters;
predicting an aging state of the battery based on the sigmoidal rate expression and the future parameters; and
at least one of:
adjusting a charging profile of the battery based on the aging state;
adjusting a usage profile of the battery based on the aging state; and
isolating the battery based on the aging state.

2. The method of claim 1, wherein the measured data comprises one or more of: capacity-loss data comprising discharge-capacity measurements of the battery at two or more times, conductance-loss data comprising conductance or resistance measurements of the battery at two or more times, and power-fade data comprising power measurements of the battery at two or more times.

3. The method of claim 1, further comprising:
measuring a first capacity of the battery after a first cycle of the battery at a first time;
measuring a second capacity of the battery after a second cycle of the battery at a second time; and
generating the measured data based on the first capacity and the second capacity.

4. The method of claim 1, wherein each of the historical parameters and the future parameters relate to an aging mechanism, and comprise:
a rate constant;
an order of a reaction; and
a maximum extent of aging.

5. The method of claim 1, wherein generating the historical parameters comprises applying curve fitting to the sigmoidal rate expression including the measured data to obtain the historical parameters.

6. The method of claim 1, wherein predicting the future parameters comprises extrapolating the sigmoidal rate expression, including the historical parameters, to obtain the future parameters.

7. The method of claim 1, wherein predicting the aging state of the battery comprises calculating the aging state from the sigmoidal rate expression including the future parameters.

8. The method of claim 1, further comprising, prior to predicting the future parameters, determining that the historical parameters have converged by comparing the historical parameters to a threshold.

9. The method of claim 1, further comprising:
generating second historical parameters of a second sigmoidal rate expression based on the second sigmoidal rate expression and the measured data; and
predicting second future parameters of the second sigmoidal rate expression based on the second sigmoidal rate expression and the second historical parameters,
wherein predicting the aging state of the battery is further based on the second sigmoidal rate expression and the second future parameters.

10. The method of claim 9, wherein the sigmoidal rate expression is related to a loss of lithium inventory and the second sigmoidal rate expression is related to a loss of active electrode material.

11. The method of claim 1, further comprising one or more of:
identifying a potentially unsafe condition of the battery based on the aging state;
determining a probability of a failure of the battery based on the aging state;
predicting an end of life of the battery based on the aging state;
generating a first recommendation indicative of charging instructions for the battery, the first recommendation based on the aging state;
generating a second recommendation indicative of usage instructions for the battery, the second recommendation based on the aging state; and
retiring the battery based on the aging state.

12. The method of claim 1, wherein the usage profile comprises proscribed environmental conditions and the usage instructions comprise recommended environmental conditions.

13. The method of claim 1, wherein the measured data of the battery is of one or more cells of the battery and predicting an aging state of the battery comprises predicting an aging state of the one or more cells of the battery.

14. A method comprising:
synthesizing training data based on measured battery data, a sigmoidal rate expression, and ranges for parameters of the sigmoidal rate expression;
training a machine-learning model using the synthesized training data;
using the machine-learning model to predict an aging state of a battery by inputting measured battery data of the battery into the machine-learning model; and
at least one of:
adjusting a charging profile of the battery based on the aging state;
adjusting a usage profile of the battery based on the aging state; and
isolating the battery based on the aging state.

15. The method of claim 14, wherein synthesizing the training data comprises:
generating parameters for the sigmoidal rate expression, the parameters within the ranges; and
calculating capacity data using the parameters in the sigmoidal rate expression, the training data comprising the capacity data.

16. The method of claim 15, wherein generating the parameters comprises performing a grid search within the ranges to generate the parameters.

17. The method of claim 15, further comprising discarding the synthesized training data that is not within a threshold from the measured battery data.

18. The method of claim 14, wherein the measured battery data comprises one or more of: capacity-loss data comprising discharge-capacity measurements of a battery at two or more times, conductance-loss data comprising conductance measurements of the battery at two or more times, and power-fade data comprising power measurements of the battery at two or more times.

19. The method of claim 14, wherein the ranges for parameters comprise ranges of suitable values for parameters of the sigmoidal rate expression.

20. The method of claim 14, wherein the parameters comprise:

a rate constant;

an order of reaction; and a maximum extent of aging.

21. The method of claim 14, further comprising using the machine-learning model to predict an aging state of a battery by inputting measured battery data of the battery into the machine-learning model.

22. The method of claim 14 further comprising:

synthesizing second training data based on the measured battery data, a second sigmoidal rate expression, and second ranges for second parameters of the second sigmoidal rate expression, wherein training the machine-learning model further comprises training the machine-learning model using the second training data.

23. The method of claim 22, wherein the sigmoidal rate expression is related to a loss of lithium inventory and the second sigmoidal rate expression is related to a loss of active electrode material.

24. The method of claim 14, wherein training the machine-learning model further comprises training the machine-learning model using the measured battery data.

25. A method comprising:

generating future parameters of a sigmoidal rate expression by inputting measured battery data of a battery into a machine-learning model;

calculating an aging state of the battery from the sigmoidal rate expression including the future parameters; and one or more of:

adjusting a charging profile of the battery based on the aging state;

adjusting a usage profile of the battery based on the aging state; and isolating the battery based on the aging state.

26. The method of claim 25, further comprising:

generating perturbed battery data based on the measured battery data;

generating perturbed future parameters of the sigmoidal rate expression by inputting the perturbed battery data into the machine-learning model;

calculating perturbed aging-state data from the sigmoidal rate expression including the perturbed future parameters; and generating confidence metrics regarding the aging state based on a relationship between the aging state and the perturbed aging-state data.

27. The method of claim 26, wherein generating the perturbed battery data comprises adding random values to the measured battery data.

28. The method of claim 27, further comprising generating the random values using the measured battery data as a mean value of one or both of a uniform distribution or a normal distribution.

29. The method of claim 26, further comprising conditioning the perturbed battery data by extrapolating between data points of the perturbed battery data prior to generating the perturbed future parameters.

30. The method of claim 25, further comprising conditioning the measured battery data by extrapolating between data points of the measured battery data prior to generating the future parameters.

31. The method of claim 25, wherein the machine-learning model was trained using synthesized training data based on the measured battery data, the sigmoidal rate expression, and ranges for parameters of the sigmoidal rate expression.

32. The method of claim 25, further comprising one or more of:

identifying a potentially unsafe condition of the battery based on the aging state;

determining a probability of a failure of the battery based on the aging state;

predicting an end of life of the battery based on the aging state;

generating a first recommendation indicative of charging instructions for the battery, the first recommendation based on the aging state;

generating a second recommendation indicative of usage instructions for the battery, the second recommendation based on the aging state; and retiring the battery based on the aging state.

33. The method of claim 32, wherein the usage profile comprises proscribed environmental conditions and the usage instructions comprise recommended environmental conditions.

34. A method comprising:

measuring a first capacity of a first battery after a first cycle of the first battery at a first time;

recording first conditions relative to usage of the first battery before the first time;

measuring a second capacity of the first battery after a second cycle of the first battery at a second time;

recording second conditions relative to usage of the first battery between the first time and the second time;

applying curve fitting to a sigmoidal rate expression including the first capacity and the second capacity to obtain first historical parameters;

predicting second historical parameters of a second battery based on a relationship between third conditions of the second battery and both of the first conditions and the second conditions;

predicting an aging state of the second battery based on the second historical parameters; and at least one of:

adjusting a charging profile of the second battery based on the aging state;

adjusting a usage profile of the second battery based on the aging state; and isolating the second battery based on the aging state.

* * * * *